United States Patent
Kirshberg et al.

(10) Patent No.: US 6,976,527 B2
(45) Date of Patent: Dec. 20, 2005

(54) MEMS MICROCAPILLARY PUMPED LOOP FOR CHIP-LEVEL TEMPERATURE CONTROL

(75) Inventors: Jeffrey Kirshberg, Berkeley, CA (US); Kirk L. Yerkes, Miamisburg, OH (US); Dorian Liepmann, Lafayette, CA (US)

(73) Assignee: The Regents of the University of California, Oakland, CA (US)

( * ) Notice: Subject to any disclaimer, the term of this patent is extended or adjusted under 35 U.S.C. 154(b) by 398 days.

(21) Appl. No.: 10/198,626

(22) Filed: Jul. 16, 2002

(65) Prior Publication Data

US 2003/0066625 A1 Apr. 10, 2003

Related U.S. Application Data

(60) Provisional application No. 60/306,264, filed on Jul. 17, 2001.

(51) Int. Cl.[7] .............................................. F28D 15/00
(52) U.S. Cl. ........................ 165/104.33; 165/104.26; 165/80.4; 361/700; 257/715; 174/15.2
(58) Field of Search ........................ 165/185, 104.21, 165/104.33, 80.3; 361/699, 700; 257/706, 722, 714–716; 174/15.2

(56) References Cited

U.S. PATENT DOCUMENTS

| | | | | | |
|---|---|---|---|---|---|
| 4,322,737 | A | * | 3/1982 | Sliwa | 357/82 |
| 4,386,505 | A | * | 6/1983 | Little | 62/514 |
| 4,392,362 | A | * | 7/1983 | Little | 62/514 |
| 5,611,214 | A | * | 3/1997 | Wegeng | 62/498 |
| 6,437,981 | B1 | * | 8/2002 | Newton et al. | 361/700 |
| 6,443,222 | B1 | * | 9/2002 | Yun et al. | 165/104.26 |
| 6,474,074 | B2 | * | 11/2002 | Ghoshal | 62/3.7 |
| 6,501,654 | B2 | * | 12/2002 | O'Connor et al. | 361/699 |
| 6,533,840 | B2 | * | 3/2003 | Martin | 95/45 |
| 6,596,545 | B1 | * | 7/2003 | Wagner et al. | 436/518 |
| 6,741,469 | B1 | * | 5/2004 | Monfarad | 361/700 |
| 6,785,135 | B2 | * | 8/2004 | Ohmi | 361/700 |
| 6,840,310 | B2 | * | 1/2005 | Tonosaki et al. | 165/104.21 |
| 2002/0130408 | A1 | * | 9/2002 | Pike et al. | 257/714 |
| 2005/0092466 | A1 | * | 5/2005 | Tonosaki et al. | 165/104.21 |

FOREIGN PATENT DOCUMENTS

WO    WO 00/75764 A1    12/2000

OTHER PUBLICATIONS

Malik et al., "Steady-state investigation of vapor deposited micro heat pipe arrays" *Journal of Electronic Packaging* (1995) 117:75–81.

Harms et al., "Developing connective heat transfer in deep rectangular microchannels" *International Journal of Heat and Fluid Flow* (1999) 20:149–157.

(Continued)

Primary Examiner—Terrell Mckinnon
(74) Attorney, Agent, or Firm—Beyer Weaver & Thomas LLP

(57) ABSTRACT

A microcapillary pumped loop (CPL) for chip level temperature control includes two mating substrates which define an evaporator, a condenser, and a reservoir for a liquid. A first substrate includes a vapor line which couples vapor from the evaporator to the condenser, and a liquid line which couples liquid from the condenser back to the evaporator. A wicking structure for the evaporator is formed by etching in the second substrate. The wicking structure couples the evaporator to the reservoir and to the liquid line. The condenser includes a plurality of grooves formed in the second substrate which couples liquid from the condenser to the liquid line.

21 Claims, 7 Drawing Sheets

OTHER PUBLICATIONS

Hölke et al., "Coherent macro porous silicon as a wick structure in an integrated microfluidic two–phase cooling system" *SPIE* 3515:154–162.

Kirshberg et al., "Micro–cooler for chip–level temperature control" *SAE Aerospace Systems Conference*, Mesa, AZ (1999) pp. 233–237.

Kirshberg et al., "Demonstration of a micro–CPL based on MEMS fabrication technologies" AIAA *35th Intersociety Energy Conversion Engineering Conference*, Las Vegas, NV (Jul. 24–27, 2000) pp. 1198–1204.

Kirshberg et al., "Cooling effect of a MEMS based micro capillary pumped loop for chip–level temperature control" *ASME 2000 International Mechanical Engineering Congress and Exposition* (Nov. 5–10, 2000) pp. 1–8.

Faghri, *Heat Pipe Science and Technology*, Taylor & Francis Publishers (1995) The title page and table of contents are submitted herewith.

Liao et al., "Evaporative heat transfer in a capillary structure heated by a grooved block" *Journal of Thermoplastics and Heat Transfer* (1999) 13(1):126–133.

Dickey et al., "Experimental and analytical investigation of a capillary pumped loop" *Journal of Thermoplastics and Heat Transfer* (1994) 8(3):602–607.

Faghri et al., *Heat Pipes and Capillary Pumped Loops*, The American Society of Mechanical Engineers (1993) The title page, table of contents and author index are submitted herewith.

Peterson et al., "Experimental investigation of micro heat pipes fabricated in silicon wafers" *Journal of Heat Transfer* (1993) 115:751–756.

* cited by examiner

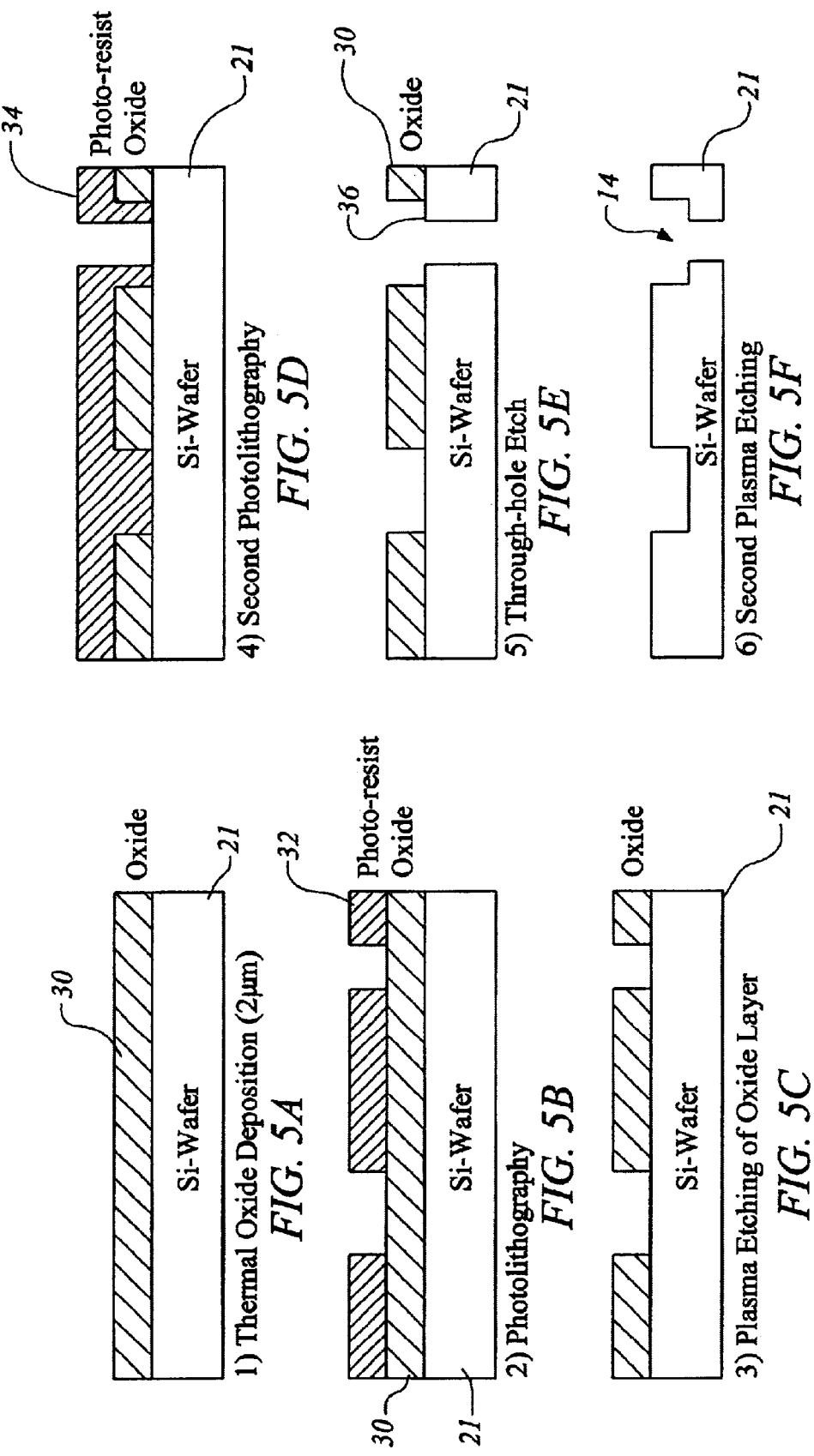

1) Undoped Polysilicon Deposition (1μm)

2) Photolithography

3) Wet Etch using Silicon Etchant

4) Wet Etch using Condensed HF (30μm)

5) Removal of Poly using Silicon Etchant

MEMS MICROCAPILLARY PUMPED LOOP FOR CHIP-LEVEL TEMPERATURE CONTROL

CROSS-REFERENCES TO RELATED APPLICATIONS

This application claims priority from Provisional Application No. 60/306,264 filed Jul. 17, 2001 which is incorporated herein for all purposes.

STATEMENT AS TO RIGHTS TO INVENTIONS MADE UNDER FEDERALLY SPONSORED RESEARCH OR DEVELOPMENT

Government Funding

This invention was made with Government support under contract number F33615-97-1-2788 awarded by the United States Air Force. The Government has certain rights in this invention.

BACKGROUND OF THE INVENTION

This invention relates generally to the cooling of micro-devices such as integrated circuits for example, and more particularly the invention relates to a microelectromechanical system (MEMS) which provides a microcapillary pumped loop (CPL) for heat removal from micro-devices.

Heat sinks have long been used with electronic components such as power transistors and integrated circuits for the removal of heat generated by the component. However, as electronic packages increase in complexity and continue to require more power, thermal management becomes a significant limiting factor. Heretofore, thermal conductivity has been altered for an electronics package through use of micro-heat pipes. Hoelke et al., "Analysis of the Heat Transfer Capacity of a Micromachined Loop Heat Pipe," Proceedings of ASME Heat Transfer Division, HTD-Volume 364-3, 1999, pp. 53–60, proposed the use of a two-port microcapillary pumped loop (CPL).

The present invention is directed to providing an improved MEMS microcapillary pumped loop using a three-port design.

BRIEF SUMMARY OF THE INVENTION

In accordance with an embodiment of the invention, a three-port MEMS microcapillary pumped loop (CPL) is provided using a two-substrate structure in which one substrate can be an integrated circuit substrate to be cooled. One substrate includes a pressurized liquid reservoir, an evaporator, and a condenser with a line for passing vapor from the evaporator to the condenser and a line for passing condensed liquid back to the evaporator. A mating substrate has a first plurality of grooves for a wick structure which overlaps the evaporator and communicates with the liquid reservoir. A second plurality of grooves is formed in the mating substrate and overlies the condenser and communicates with the liquid line. Preferably a thin film coating, such as a polymer, is applied to the vapor line and to vapor plenum areas to decrease surface tension and increase thermal insulation. A line of posts extends from the one substrate into the evaporator to separate vapor and liquid.

In fabricating the MEMS micro-CPL in accordance with the invention, dry reactive ion etching (DRIE) is employed to form deep and flat channels, and a two-step DRIE process is utilized to form through holes inside of fluidic channels. The base substrate is preferably silicon, and the mating substrate can be glass, quartz, or a semiconductor substrate of an integrated circuit.

A micropump can be used to enhance the performance of the micro-CPL in accordance with the invention, or the micro-CPL can function passively on its own. Further, one electronic package can be cooled with multiple micro-CPL devices through a radial configuration of the devices.

The invention and objects and features thereof will be more readily apparent from the following detailed description and appended claims when taken with the drawings.

BRIEF DESCRIPTION OF THE DRAWINGS

FIGS. 5A–5F are section views illustrating steps in fabricating fluidic channels in a base wafer in accordance with the invention.

DETAILED DESCRIPTION OF THE INVENTION

Figure 1:
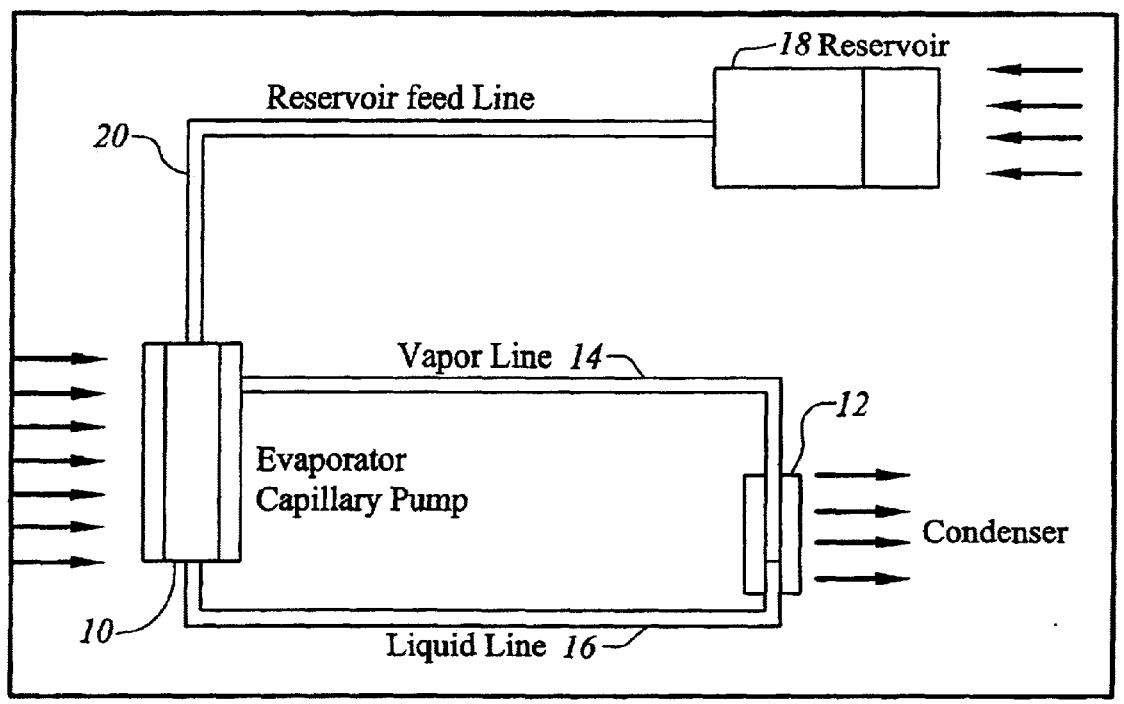
FIG. 1 is a schematic of a micro-CPL device.

FIG. 1 is a schematic of a microcapillary pumped loop including a micro-CPL. The structure includes an evaporator 10, a condenser 12 with a vapor line 14 connecting vapor from evaporator 10 to condenser 12, and a liquid line 16 for coupling condensed fluid in condenser 12 back to evaporator 10. A fluid reservoir 18 is connected by a reservoir feed line 20 to evaporator 10 in initially charging the loop with fluid and replenishing fluid. Reservoir 18 includes a hole (not shown) for receiving coolant from a pressurized source outside of the loop. Additionally, condenser 12 can include a hole to an outside pump when the loop is employed with a pump in an active system.

Figure 2:
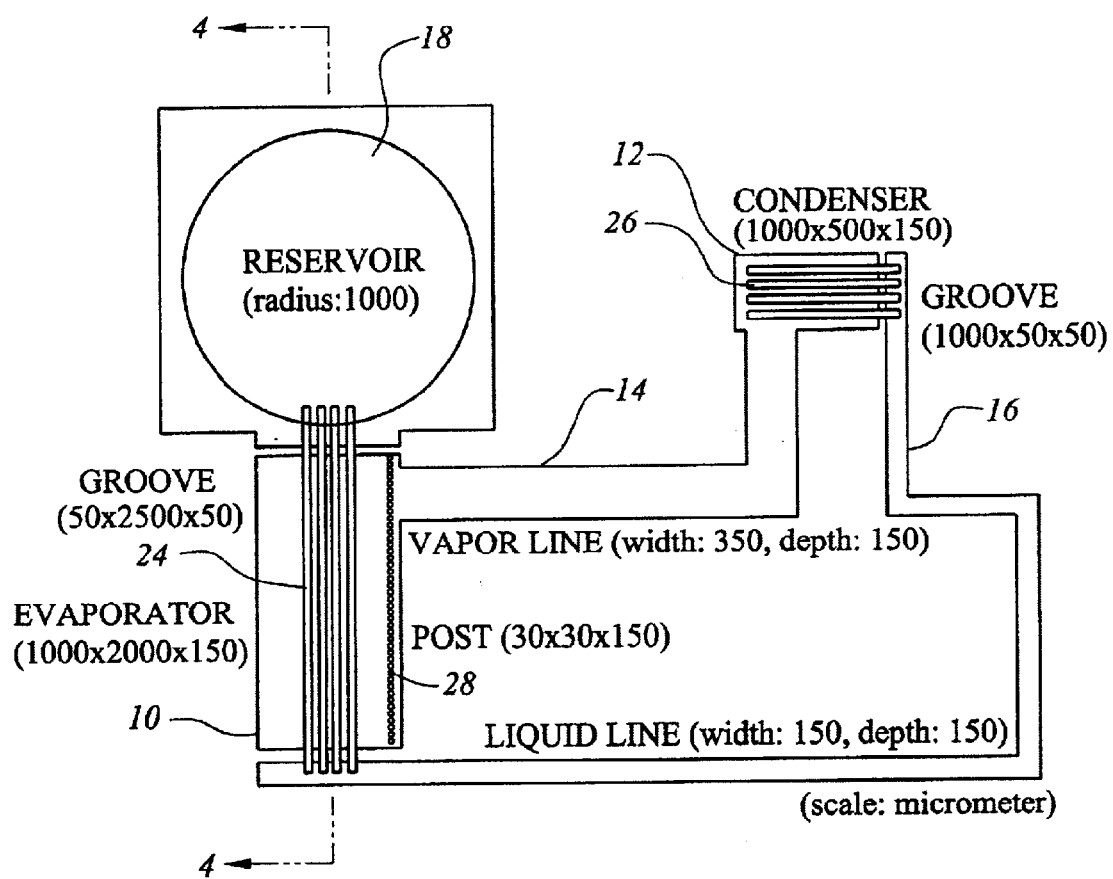
FIG. 2 is a plan view of a micro-CPL device in accordance with an embodiment of the present invention.

FIG. 2 is a plan view of a micro-CPL in accordance with one embodiment of the invention which is fabricated in two mating substrates as will be described with reference to FIG. 3. Again, evaporator 10 is coupled to condenser 12 by means of a vapor line 14, and condensed liquid from condenser 12 is coupled to liquid line 16 for return to the evaporator 10. Reservoir 18 is placed in close proximity to evaporator 10 and is coupled thereto by means of a plurality of grooves 24 which form a wicking structure for the conversion of liquid to a vapor in the heat exchanger and with the wicking structure coupling the evaporator 10 to liquid line 16 and reservoir 18. Similarly, grooves 26 facilitate the exchange of heat from the vapor to an outside heat sink with the condensed liquid then being coupled to liquid line 16. Preferably a thin film coating, such as a self-assembled monolayer polymer such as Teflon, for example, is applied to the vapor line and to vapor plenum areas to decrease surface tension and increase thermal insulation. In this embodiment, a line of posts 28 extend into evaporator 24 to separate vapor and liquid coolant.

Figure 3:
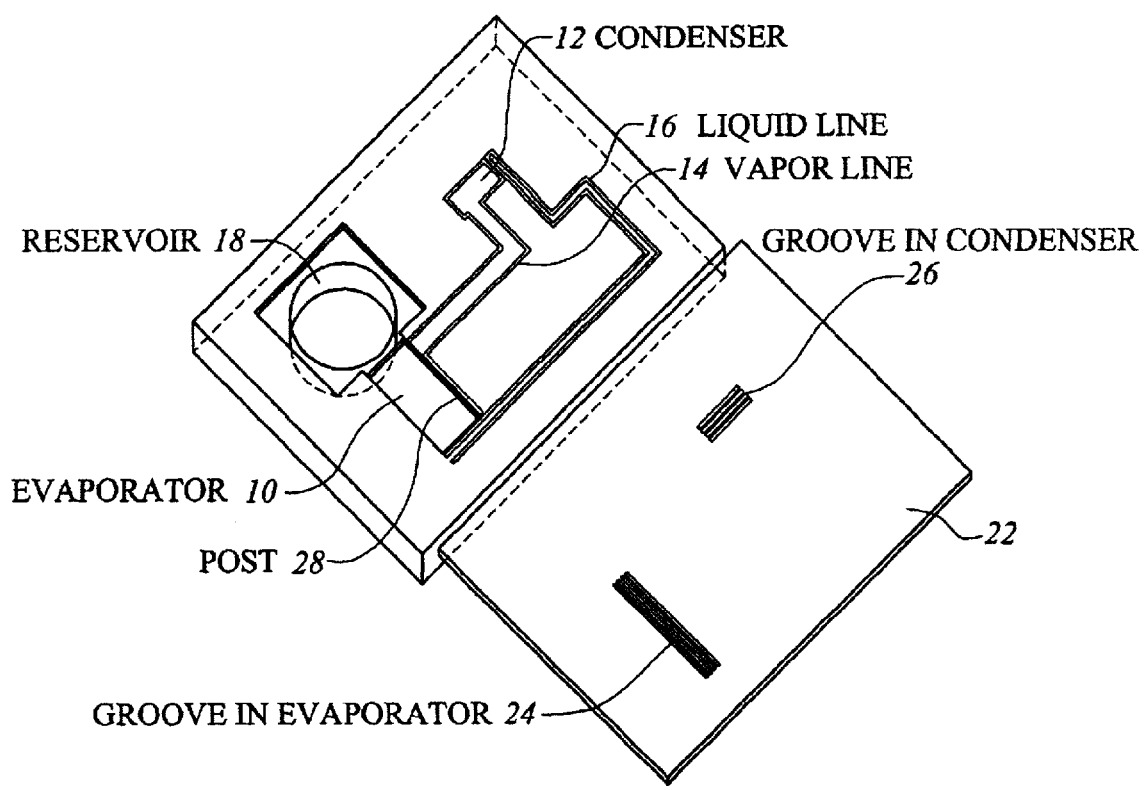
FIGS. 3 is a perspective view of a base substrate and a mating substrate for the micro-CPL shown in FIG. 2.

In accordance with the invention, the micro-CPL is fabricated using at least two substrates as shown in FIG. 3 with a first substrate shown in FIG. 3A etched to form evaporator 10, condenser 12, vapor line 14, and liquid line 16 and posts 28. Reservoir 18 is formed in close proximity to evaporator 10 and is coupled thereto by the plurality of grooves 24 formed in a bottom surface of the second substrate 22. A second plurality of grooves 26 in the bottom surface cooperate with condenser 12 as a heat exchanger and transports condensed liquid to liquid line 26.

Preferably, the first substrate 21 is a semiconductor material such as silicon which is readily processed using conventional semiconductor device fabrication techniques, and the second substrate 22 can be glass or quartz material on which a heat generating device is placed, or alternatively substrate 22 can be a semiconductor substrate of an integrated circuit.

Figure 4A:
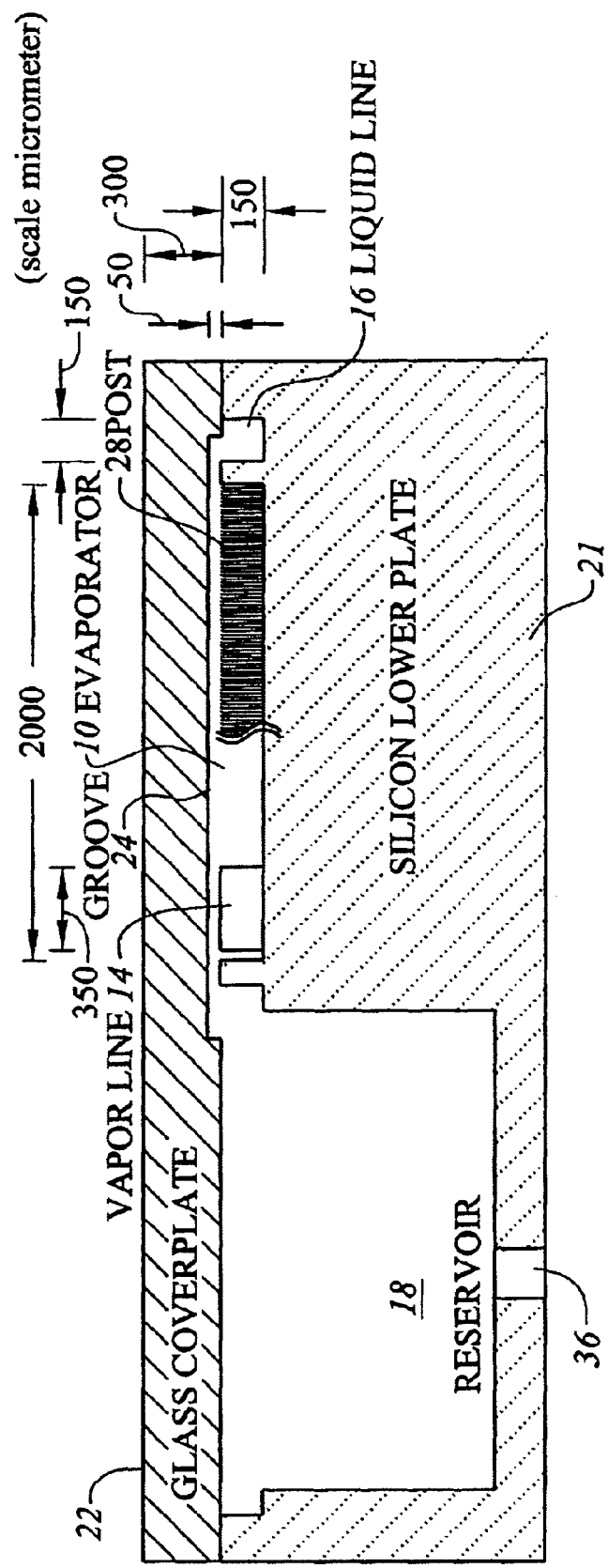
FIGS. 4A and 4B are side views taken along the line 4—4 of FIG. 2 and illustrate the micro-CPL when empty and when filled and functioning, respectively.
Figure 4B:
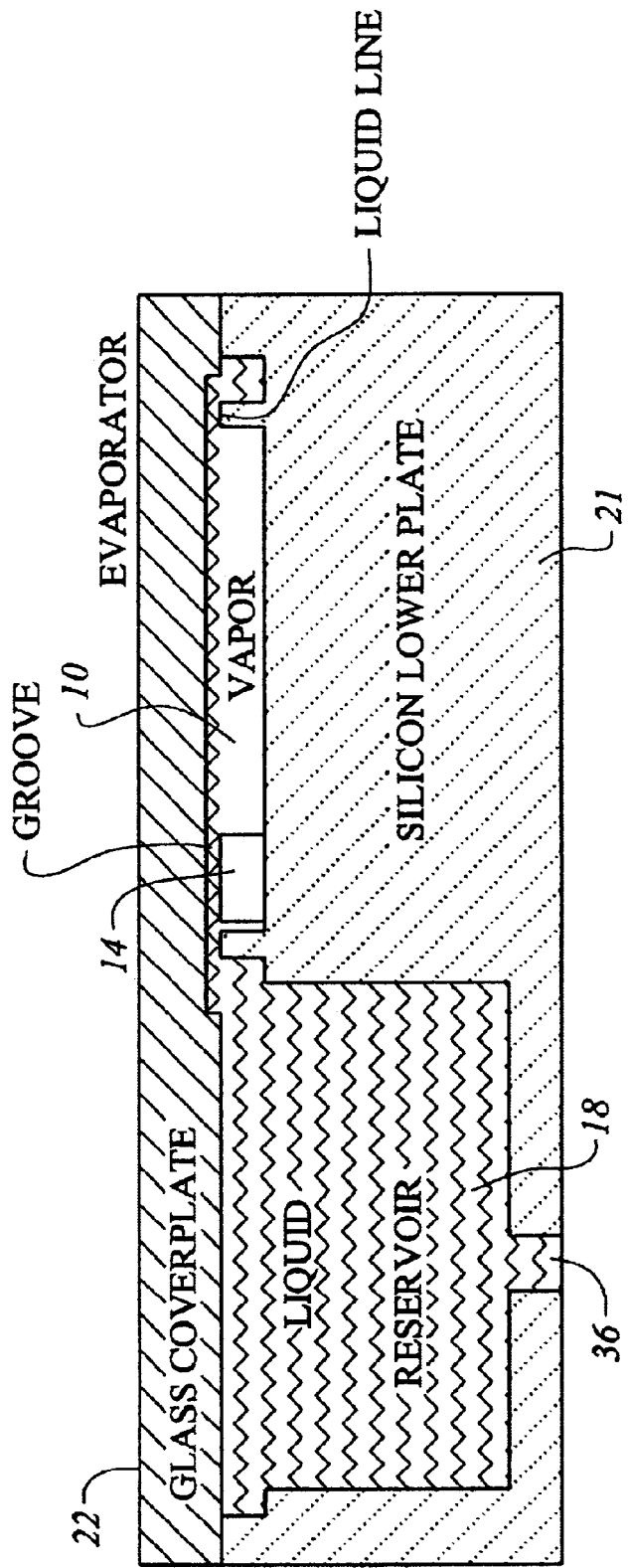

FIGS. 4A, 4B are section views taken along the line 4—4 of FIG. 2 and illustrate the micro-CPL when empty and when filled and functioning, respectively. In this embodiment, a glass cover plate 22 mates with the semiconductor substrate 21 with grooves 24 providing liquid communication between reservoir 18 and evaporator 10. Posts 28 can extend from the silicon substrate 21 into the evaporator and function to further separate vapor and liquid during the startup of the device. In FIG. 4B reservoir 18 is filled with liquid through hole 36, and wicking structure 24 in the evaporator transports liquid from reservoir 18 and from liquid line 16 to the evaporator where the liquid is converted to vapor in heat exchange with an external heat generating structure. The vapor is then transferred through vapor line 14 to the condenser 12.

In one embodiment the reservoir has a radius of 1000 micron, the evaporator has the dimensions of 1000×2000×150 micron, and the condenser has dimensions 1000×500×150 micron. The vapor line 14 has a width of 350 microns and a depth of 150 microns, and the liquid line has a width of 150 microns and a depth of 150 microns. The wicking structure 24 includes a plurality of grooves, each of which is 50 microns wide, 50 microns deep, and 2500 microns in length. Groove structure 26 in the condenser has a plurality of grooves, each of which is 1000 micron in length, 500 micron wide and 50 micron deep. Posts 28 are each 30 micron square by 150 micron in length spaced ten microns and extending from substrate 21.

The microcapillary pumped loop in accordance with the invention is readily fabricated using conventional semiconductor device fabrication techniques including photoresist masking and etching. FIGS. 5A–5F are side views in section illustrating the steps in fabricating the fluidic channels in the bottom silicon wafer 21. In FIG. 5A semiconductor wafer 21 is thermally oxidized to form a silicon oxide layer 30 of approximately two micron thickness. In FIG. 5B, a photoresist mask 32 is formed over oxide layer 30 with portions of oxide 30 exposed through mask 32 being removed by dry reactive ion plasma etching (DRIE) as shown in FIG. 5C.

Thereafter, as shown in FIG. 5D, a second photoresist mask 34 is formed over the etched silicon oxide with a window formed for the etching of a hole 36, as shown in FIG. 5E. Again, reactive ion etching is employed with an etchant for silicon. Plasma etching produces a hole with essentially vertical sidewalls in an anisotropic etching process. Photoresist masking layer is removed as shown in FIG. 5E and the exposed silicon wafer 34 is further etched using the silicon oxide layer as an etchant mask for forming the fluidic channels and a port to a pump or to an external reservoir. Thus, the shape of the fluidic channels including the posts are defined using standard photolithographic masking and etching techniques on top of a thermal oxide layer already grown on the silicon wafer.

Figure 6A:
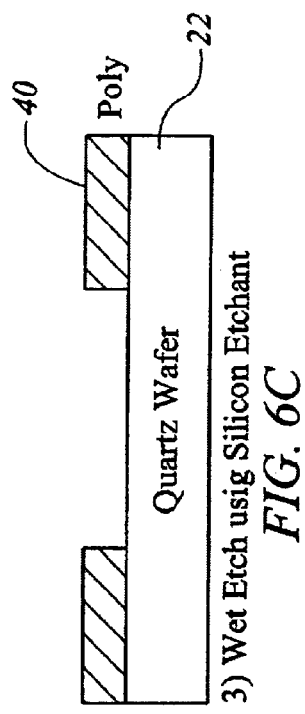
FIGS. 6A–6E are section views illustrating the fabrication of a wicking structure in a mating substrate.
Figure 6B:
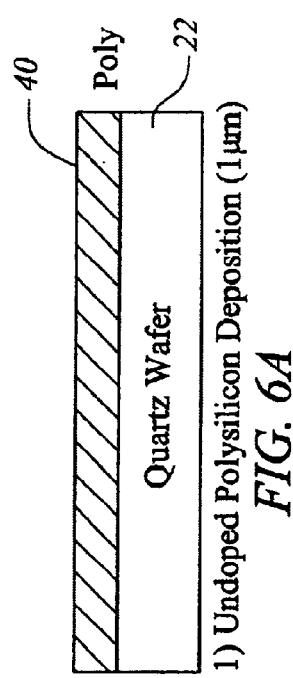
Figure 6C:
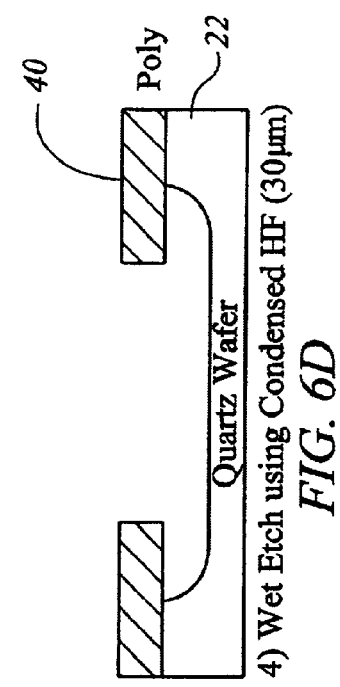
Figure 6D:
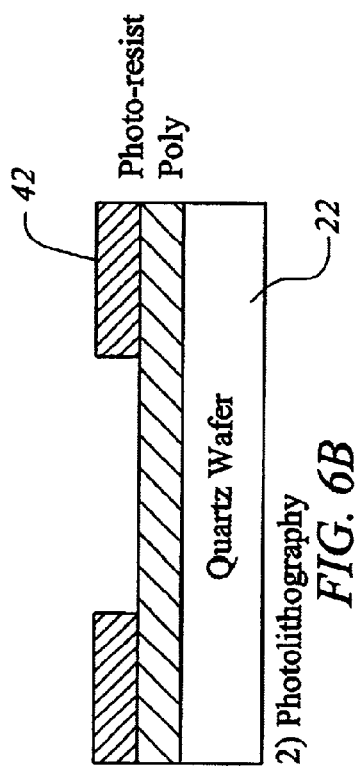
Figure 6E:
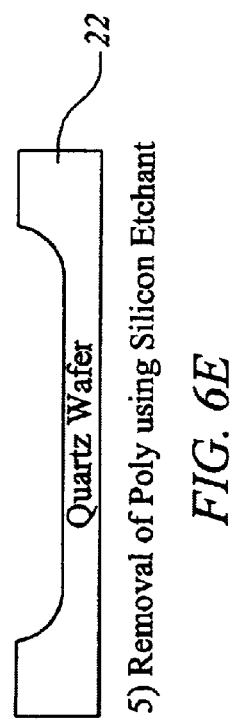

The top wafer can be a silicon substrate such as an integrated circuit or either a glass wafer or a quartz wafer. For a silicon substrate the fabrication techniques of FIGS. 5A–5F can be employed. FIGS. 6A–6E illustrate steps in fabricating the grooved structures in a glass wafer for the top substrate. First, as shown in FIG. 6A a burofloat glass wafer 22 has a layer of polysilicon 40 deposited thereon. The channels which serve as the wicking structure are patterned utilizing standard photolithographic techniques as shown in FIG. 6B. A photoresist mask 42 is used to expose a selected portion of polysilicon layer 40 which is removed by wet silicon etchant as shown in FIG. 6C. Once the photoresist is stripped, hydrofluoric acid is used to chemically etch the glass as shown in FIG. 6D. Finally, the remaining silicon 40 is removed using a silicon etchant as shown in FIG. 6E.

The process in fabricating a quartz wafer as the top substrate is similar to the techniques described above for a glass wafer. In bonding the quartz wafer to the silicon wafer the wafers are aligned and pressed together forming a van der Waals bond in a Karl Suss bonder. The wafers are then heated to 1000° C. and pressed together, thus creating a fusion bond.

A MEMS microcapillary pumped loop in accordance with the invention is further described in Kirshberg, Yerkes, and Liepmann, "Demonstration of A Micro-CPL Based on MEMS Fabrication Technologies," AIAA Conference in Las Vegas, Jul. 24, 2000, incorporated herein by reference for all purposes. The micro-CPL in accordance with the invention can be used as a passive closed loop structure or can be used with an external pump in an active heat exchange operation. The use of axial grooves with vertical sidewalls and flat bottoms in the wicking structure along with the fence of posts for separating liquid and vapor facilitates the removal of heat from an external heat generating device to the condenser at a removed location. Moreover, a plurality of micro-CPL structures in accordance with the invention can be arranged in a radial pattern and used for cooling a single heat source.

Additional features of the invention can include the addition of heaters in the vapor line to aid start up of the device and the addition of a second reservoir feed line to the evaporator to aid in keeping the wick from drying out. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A microcapillary pumped loop (CPL) comprising:
    a) a first substrate having therein a pressurized liquid reservoir, an evaporator adjacent to the reservoir, a condenser, a vapor line for coupling vapor from the evaporator to the condenser, and a liquid line for coupling liquid from the condenser back to the evaporator, and
    b) a second substrate mating with the first substrate and including a wick structure over the evaporator and coupled to the liquid reservoir and to the liquid line and functioning to convert a liquid to a vapor in response to heat, and a groove structure over the condenser and coupled to the liquid line, the groove structure facilitating heat removal through the second substrate.

2. The micro-CPL structure as defined by claim 1 wherein the first substrate comprises a silicon substrate.

3. The micro-CPL structure as defined by claim 2 wherein the vapor line and the liquid line are formed by reactive ion etching with vertical sidewalls and a flat bottom surface.

4. The micro-CPL structure as defined by claim 2 and further including a plurality of posts extending from the first substrate into the evaporator for separating vapor and liquid.

5. The micro-CPL structure as defined by claim 4 wherein the first substrate is etched by reactive ion etching.

6. The micro-CPL structure as defined by claim 5 wherein the second substrate comprises a material selected from the group consisting of glass and quartz.

7. The micro-CPL structure as defined by claim 6 wherein the wick structure and the groove structure are formed by a wet etch process.

8. The micro-CPL structure as defined by claim 5 wherein the second substrate comprises silicon.

9. The micro-CPL structure as defined by claim 8 wherein the second substrate includes an integrated circuit.

10. The micro-CPL structure as defined by claim 8 wherein the wick structure and the groove structure are formed by reactive ion etching.

11. The micro-CPL structure as defined by claim 3 wherein the second substrate comprises silicon.

12. The micro-CPL structure as defined by claim 11 wherein the second substrate includes an integrated circuit.

13. The micro-CPL structure as defined by claim 12 wherein the wick structure and the groove structure are formed by reactive ion etching.

14. The micro-CPL structure as defined by claim 3 and further including a plurality of posts extending from the first substrate into the evaporator for separating vapor and liquid.

15. The micro-CPL structure as defined by claim 3 wherein the second substrate comprises a material selected from the group consisting of glass and quartz.

16. The micro-CPL structure as defined by claim 15 wherein the wick structure and the groove structure are formed by a wet etch process.

17. The micro-CPL structure as defined by claim 16 and further including a plurality of posts extending from the first substrate into the evaporator for separating vapor and liquid.

18. The micro-CPL structure as defined by claim 1 and further including a first hole in the first substrate for communicating with an external pressurized reservoir.

19. The micro-CPL structure as defined by claim 18 and further including a second hole in the first substrate connecting with the condenser.

20. The micro-CPL structure as defined by claim 1 and further including a thin film polymer coating of the vapor line to decrease surface tension and increase thermal insulation.

21. The micro-CPL structure as defined by claim 20 wherein the polymer is a self-assembled monolayer polymer.

* * * * *